(12) United States Patent
Kihara et al.

(10) Patent No.: US 6,197,473 B1
(45) Date of Patent: Mar. 6, 2001

(54) PHOTOSENSITIVE COMPOSITION AND A PATTERN FORMING PROCESS USING THE SAME

(75) Inventors: Naoko Kihara, Matsudo; Satoshi Saito, Yokohama; Toru Ushirogouchi, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/154,733

(22) Filed: Sep. 17, 1998

(30) Foreign Application Priority Data

Sep. 18, 1997 (JP) .................................................. 9-253311
Jun. 24, 1998 (JP) ................................................ 10-177479

(51) Int. Cl.$^7$ .............................. G03F 7/023; G03F 7/30
(52) U.S. Cl. ........................ 430/192; 430/165; 430/191; 430/193; 430/270.1; 430/325; 430/326; 430/330; 430/905
(58) Field of Search .................................. 430/192, 193, 430/165, 190, 191, 270.1, 325, 326, 330, 905

(56) References Cited

U.S. PATENT DOCUMENTS

| 5,143,784 | * | 9/1992 | Mita ........................ 428/336 |
| 5,173,389 | * | 12/1992 | Uenishi et al. ...................... 430/192 |
| 5,248,582 | * | 9/1993 | Uenishi et al. ...................... 430/192 |
| 5,368,977 | * | 11/1994 | Yoda et al. ........................ 430/190 |
| 5,635,328 | * | 6/1997 | Higashino et al. ................ 430/166 |
| 5,677,101 | * | 10/1997 | Noguchi et al. .................... 430/166 |
| 5,693,452 | * | 12/1997 | Aoai et al. ........................ 430/270.1 |
| 5,702,620 | * | 12/1997 | Ohnishi et al. .................... 216/49 |
| 5,707,776 | * | 1/1998 | Kawabe et al. ................... 430/270.1 |
| 6,015,649 | * | 1/2000 | Mori et al. ........................ 430/193 |
| 6,093,517 | * | 7/2000 | Ito et al. ............................ 430/270.1 |

FOREIGN PATENT DOCUMENTS 5-173333 7/1993 (JP) .
10-115927 5/1998 (JP) .

OTHER PUBLICATIONS

Tomonari Nakayama, et al., Chemistry Letters 1997, pp.265–266, "A Negative–Working Alkaline Developable Photoresist Based On Calix[4]Resorcinarene, A Cross–Linker, And A Photoacid Generator", Nov. 20, 1996.

Naoko Kihara, et al., J. Photopolym. Sci. Technol. 11, 2 pages, "EB Resist Materials Consist Of Catechol Derivatives", 1998.

J. Fujita, et al., J. Vac. Sci. Technol. B, vol. 14, No. 6, pp. 4272–4276, "Nanometer–Scale Resolution Of Calixarene Negative Resist In Electron Beam Lithography", Nov./Dec., 1996.

M. Ueda, et al., Proc. Of 6th SPSJ International Polymer Conference, p. 103, "Calix[4]Resorcinarene–Dendrimer As A New Photoresist Material", 1997.

* cited by examiner

Primary Examiner—John S. Chu
(74) Attorney, Agent, or Firm—Oblon, Spivak, McClelland, Maier & Neustadt, P.C.

(57) ABSTRACT

The objectives of the present invention are to provide a photosensitive composition having high solubility to organic solvents as well as to alkaline developers or water-base developers of pH 11 or less, and to provide a pattern forming process for obtaining a high-resolution resist pattern.

These objectives are achieved by means of a photosensitive composition comprising a compound which is glassy at room temperature and has a cyclic structure with three or more aromatic rings containing an acid-decomposable substituent, and a pattern forming process wherein a photosensitive material using said photosensitive composition is exposed to a light pattern and developed with an aqueous solution of an alkali or with a water-base developer of pH 11 or less.

26 Claims, 1 Drawing Sheet

F I G. 1

PHOTOSENSITIVE COMPOSITION AND A PATTERN FORMING PROCESS USING THE SAME

FIELD OF INVENTION

The present invention relates to a photosensitive composition developable with an alkali solution or water and applicable to microprocessing for the production of semiconductor devices and other elements, and a pattern forming process using said photosensitive composition.

BACKGROUND OF THE INVENTION

In the production of electronic components such as larges-cale integrated circuits (LSI), microprocessing techniques using photolithography have been employed. In these techniques, a resist solution is first applied to a substrate to form a resist film. Then, the obtained resist film is exposed to a light pattern or a scanning beam, and developed with an alkali solution or other developer to form a resist pattern. Next, the exposed substrate is etched by RIE or other method, with the resist pattern used as a mask, to draw fine lines and spaces. Then, finally, the resist is removed.

Therefore, a resist for this purpose generally should be highly resistant to dry etching.

For this reason, resists containing aromatic compounds have been widely used. Much kind of resists contains novolac resin or polyhydroxystyrene, which are soluble to alkalis, were developed as a primary component.

In the mean time, with the recent increase in the density of integrated circuits, microprocessing technology today has been achieved to an order of subhalfmicron, and will be even required to smaller scale in the future. To meet this requirement, increasingly shorter wavelengths are used for photolithographic light sources, such as an ArF excimer laser beam with a wavelength of 193 nm and a fifth-harmonic YAG laser with a wavelength of 218 nm, which are experimentally applied to fine pattern forming. Copolymer such as polyacrylic acids combined with alicyclic compounds or the copolymer of norbornene and maleic anhydride were attempted to apply for resists for use at these short wavelengths, since phenol derivatives having a benzene ring as listed above are unsuitable for their poor transparency.

On the other hand, even finer patterning at 0.05 μm or less is required for the experimental production of microwave semiconductor elements and quantum effect devices. However, resolution cannot be made significantly higher using polymerbased resists as listed above because of their shortcomings such as edge roughness due to large molecular sizes, as reported by Yoshimura, et al. (J. Photopolym. Sci. Technol., 10, 629 (1997)).

In an attempt to improve the resolution, an EB resist using a derivative of a cyclic phenol such as calixarene, which has a high heat resistance and a low molecular weight, has been reported (J. Photopolym. Sci. Technol., 10, 641 (1997)). However, calixarene does not easily dissolve in organic and water-base solvents because of its molecular structure and, furthermore, requires the use of an organic developer, which may be incompatible with the recent concern for environment.

An example of cyclic phenol derivative soluble to alkali solutions is the negative resist proposed by Nakamura, et al. (Chem. Lett. 1997 (3), 265), which uses cyclic resorcinol and contains methylol as a cross-linking agent. However, preparation of a tetramer or smaller polymer of resorcinol is difficult, and improvement of resolution is restricted.

While a resist which is developable with a water-base developer is desired, considering the concern for environment as mentioned above, the common development method with an alkali solution also involves cumbersome procedures such as the disposal of the alkaline developer. To reduce environment impact, it is preferred that the pH of the developer be lower than that of the existing ones. Currently available resists developable with a developer which has a pH of 11 or less, include polyvinyl alcohol, polyvinyl acetate or their copolymers with an acid anhydride. However, these resists have a disadvantage of high swelling property, which impairs the resolution in fine patterning.

For these reasons, it has been awaited to see a high-resolution resist composition which is soluble to a solvent for easy resist preparation and developable with an alkaline developer or a water-base developer of pH 11 or less, as well as a process for forming a resist pattern of a higher resolution. In consideration of the above, the objective of the present invention is to provide a high-resolution photosensitive composition developable by an alkaline or water-base developer and highly soluble to a solvent, and a pattern forming process using said photosensitive composition.

BRIEF DESCRIPTION OF THE INVENTION

Summary

The first photosensitive composition according to the present invention comprises a solids component and a solvent, wherein the composition containing 50% or more of a compound having formula (I) based on the total weight of solids component:

[I]

(where,

X is a divalent organic group,

R is hydrogen or a univalent organic, which may be identical or non-identical to each other, and l, m and n are integer in the range of 1 to 4, respectively, which may be identical or non-identical to each other).

Also, the first pattern forming process according to the present invention comprises:

(a) A step for applying a photosensitive composition comprising a compound having formula (I) below to a substrate to form a photosensitive layer:

[I]

(where,
X is a divalent organic group,
R is hydrogen or a univalent organic, which may be identical or non-identical to each other, and
l, m and n are integer in the range of 1 to 4, respectively, which may be identical or non-identical to each other).

(b) A step for exposing said photosensitive layer to a light pattern, and (c) A step for developing said exposed photosensitive layer with an alkaline developer.

The second photosensitive composition according to the present invention comprises:

(a) a compound which is glassy at room temperature and has a cyclic structure with three or more aromatic rings containing an acid-decomposable substituent, and (b) an acid generator, and is developable with a water-base developer of pH 11 or less.

The second pattern forming process according to the present invention comprises:

(i) a step for applying a photosensitive composition comprising:

(a) a compound which is glassy at room temperature and has a cyclic structure with three or more aromatic rings containing an acid-decomposable substituent, and (b) an acid generator, to a substrate to form a photosensitive layer, (ii) a step for exposing said photosensitive layer to a light pattern, and (iii) a step for developing said exposed photosensitive layer with a water-base developer of pH 11 or less.

Advantage

According to the present invention, a photosensitive composition, which is highly soluble to organic solvents and alkaline developers, is obtained. Also, by using said photosensitive composition, a high-resolution resist pattern is obtained. Furthermore, according to the second photosensitive composition according to the present invention and the second pattern forming process according to the present invention, a high-resolution resist pattern can be produced using a water-base developer of pH 11 or less without a swelling problem.

DETAILED DESCRIPTION OF THE INVENTION

First Photosensitive Composition

The first photosensitive composition according to the present invention comprises an alkali-soluble resist composition containing the cyclic trimer of a phenol derivative having formula (I):

[I]

where, X is a divalent organic group which may contain a heteroatom, preferably —S—, —SO$_2$—, —CH$_2$—, —CH(CH$_3$)—, —CH(CH$_2$CH$_3$)—, —C(CH$_3$)$_2$—, —CH(C$_6$H$_5$)—, —C(CF$_3$)$_2$—, —O— or —NH—; and R is hydrogen or a univalent organic group, preferably hydrogen or a univalent organic group selected from the group consisting of a substituted or unsubstituted alkyl, a substituted or unsubstituted alkoxy, a substituted or unsubstituted sulfonyl, a substituted or unsubstituted acyl group, a substituted or unsubstituted acetal group, a substituted or unsubstituted silyl, and a substituted or unsubstituted aromatic, more preferably hydrogen or methyl, ethyl, phenyl, acetyl or methanesulfonyl group. The groups R may, if necessary, be groups decomposed by an acid catalyst such as t-butyl, t-butoxycarbonyl, ethoxyethyl, tetrahydropyranyl or a trialkylsilyl group. Also, R may be substituted or unsubstituted 4- or 5-naphthoquinone diazide sulfonate group. The groups R may be identical or non-identical to each other. The numbers l, m and n, which may be identical or non-identical to each other, is integer in the range of 1 to 4.

Conventionally used cyclic phenols such as calixarene, which binds only at the ortho position of the hydroxyl group, have the advantage of high heat resistance as exhibited by high melting point, because the hydroxyl groups are positioned at the inside of the ring and, thus, produce tight hydrogen bonds. However, some of their properties, such as poor solubility to organic solvents and insolubility to aqueous alkali solution, made them unsuitable for use as a resist. On the other hand, a compound having the structure having formula (I) according to the present invention is soluble to aqueous alkali solution because the hydroxyl groups are positioned on the outside of the ring. In addition, solubility to other solvents can also be improved by selecting an appropriate substituent. Therefore, the content of solid component of the resist solution can be easily adjusted so as to attain a resist film with a suitable thickness. Also, as a compound having formula (I) is one of the smallest cyclic phenols, a higher resolution is expected when it is used in a resist composition. Moreover, it is highly resistant to dry etching as it contains aromatic rings.

Preferable compounds having formula (I) are the ones having formula (Ia) and (Ib):

[Ia]

[Ib]

The symbols X and R above are the same as in general formula (I).

These compounds can be obtained by allowing a derivative of catechol to react with an aldehyde or ketone in the presence of an acid catalyst. For example, a compound having formula (Ib) can be produced from the cyclic trimer of a catechol derivative according to the procedure reported by Canceil, et al., in the process schematically shown below:

Also, the cyclic compound having formula (I), which is used in the first photosensitive composition according to the present invention, may contain any substituent unless it impairs the effect of the present invention. Examples of such substituent include aliphatic alkyl (e.g., methyl, ethyl, propyl, pentyl or hexyl), alicyclic (e.g., cyclopentyl or cyclohexyl), aromatic (e.g., phenyl or naphthyl), heterocyclic (e.g., pyridyl, thiophenyl or pyranyl), halogens (e.g., fluorine, chlorine or bromine), nitrile, nitro, carboxyl, alkylsilanes, and the derivatives of these groups. Also, the —OR groups of a compound having formula (I) may also have one of these substituents.

When the first photosensitive composition according to the present invention is used as a negative photoresist, the following applications are considered as examples:

(1) Use the compound having formula (I) as it is;
(2) Use a derivative of a compound having formula (I) which forms cross links when exposed to radiation via double bonds, epoxy groups, etc.; or
(3) Use as a chemically amplifying negative photoresist by mixing with a compound which generates acid when exposed to an actinic radiation, and a methylol derivative or other cross-linking agent.

For the above purpose, any cross-linking agent may be used as appropriate. Thus, the resist composition according to the present invention contains a cross-linking agent which, when exposed to light or an electron beam, or when catalyzed by an acid which is produced by exposure to light or an electron beam, reacts with a phenol derivative to decelerate dissolution ratio. Examples of such cross-linking agent include:

The acid generator compound which generates acid when exposed to an actinic radiation, which is preferably added to give a patterning property to the first photosensitive composition according to the present invention is a compound such as sulfonyl, iodonium or other onium salt or sulfonyl compound, or sulfonic ester. Examples of such acid generators include:

where, x, which is any number in the range of 0 to 1, is the ratio of the monomer components.

where, x, which is any number in the range of 0 to 1, is the ratio of the monomer components.

where, Z is any substituent such as an alkyl, an alkoxy, an aryl or a halogen, and X⁺ is any cationic group.

The content of the acid generator ranges generally from 0.1 to 30% of the total weight of solid component of the photosensitive composition, preferably from 0.3 to 15%. An acid generator content lower than the above may result in inadequate sensitivity. On the other hand, a higher acid generator content may increase the light absorption by the acid generator at the exposed wavelength when, for example, a KrF excimer is used as a light source, thus decreasing the overall transparency of the formed photosensitive film.

When the first photosensitive composition according to the present invention is used as a positive photoresist composition, the photosensitive composition either contains a compound having formula (I) wherein R is 4- or 5-naphthoquinone diazide sulfonate group, or contains a compound having formula (I) and 4- or 5-naphthoquinone diazide sulfonate. A compound having formula (I) wherein at least one of the groups R is 4- or 5-naphthoquinone diazide sulfonic group can be produce by, for example, the reaction of a compound having formula (I) wherein at least one of the groups R is hydrogen and 4- or 5-naphthoquinone diazide sulfonyl chloride in the presence of a basic compound, such as triethylamine or other organic amine, or an inorganic alkali. When the first photosensitive composition according to the present invention is used as a chemically amplifying positive photoresist, a compound having formula (I), wherein all or part of the groups R are replaced with a protecting group decomposed by an acid catalyzed reaction may be used in combination with an acid generator which generates acid when exposed to an actinic radiation. Any such substituent decomposed by an acid catalyst as known in the art may be used. Examples of such substituent include: (a) ester groups such as t-butyl ester, isopropyl ester, ethyl ester, and methyl ester groups; (b) ether groups such as t-butyl ether group; (c) acetal groups such as tetrahydropyranyl ether, ethoxyethyl ether, and tetrahydrofuranyl ether groups; (d) oxycarbonyl groups such as t-butoxycarbonyl (hereinafter referred to as "t-Boc"), methoxycarbonyl, and ethoxycarbonyl; and (e) silyl ether groups such as trimethyl silyl ether, and triethyl silyl ether groups. These substituents may be bound via a methylene group or any other divalent organic group.

The acid generator used may be selected from those described earlier for the negative photoresist. The content of the acid generator ranges generally from 0.1 to 30% of the total weight of solid component of the photosensitive composition, preferably from 0.3 to 15%, as in the negative photoresist. An acid generator content lower than the above may result in inadequate sensitivity. On the other hand, a higher acid generator content may increase the light absorp- tion by the acid generator at the exposed wavelength when, for example, a KrF excimer is used as a light source, thus decreading the overall transparency of the formed photosensitive film.

Also, the first photosensitive composition described above may additionally contain, as a dissolution inhibitor, a compound having a group which exhibits solubility to alkalis when decomposed by an acid catalyst, at a content of 0 to 49.9% of the total weight of solid component of the photosensitive composition. The group which exhibits solubility to alkalis when decomposed by an acid catalyst may be selected from those listed as protecting groups which substitute for R in a compound having formula (I). Any such dissolution inhibitor as known in the art may be used. Examples of such dissolution inhibitor include:

where, n is the degree of polymerization. Although n is any number, it is preferable that the number-average molecular weight as calculated for polystyrene be 2000 or less.

When the first photosensitive composition according to the present invention is used as a chemically amplifying resist, the photosensitive composition may contain a small amount of basic compound so as to prevent the chemically amplifying resist from changing its characteristics by absorbing basic compounds existing in environment. Any basic compound may be used for this purpose unless it impairs the effect of the present invention. Examples of such basic compound include: (a) pyridine derivatives such as t-butylpyridine, benzylpyridine and various pyridinium salts; (b) aniline derivatives such as N-methylaniline, N-ethylanline and N,N'-dimethylaniline; (c) amine compounds such as diphenylamine and N-methyldiphenylamine; and (d) indene derivatives. The content of such basic compound ranges generally from 0.1 to 50 mol %, preferably from 1 to 15 mol %, based on the total mole of the acid generator. A basic compound content lower than the above may reduce the effect of the basic compound, whereas a higher content may decrease the sensitivity of the photosensitive composition.

The first photosensitive composition according to the present invention is prepared by dissolving the components described above generally in an organic solvent and, as necessary, filtrating through a membrane filter or other filter. The organic solvent is selected from those generally used in the art. Examples of such organic solvent include: (a) ketones such as cyclohexanone, acetone, ethyl methyl ketone, and methyl isobutyl ketone; (b) cellosolves such as methyl cellosolve, methyl cellosolve acetate, ethyl cellosolve acetate, and butyl cellosolve acetate; and (c) esters such as ethyl acetate, butyl acetate, isoamyl acetate, γ-butyrolactone, and methyl 3-methoxypropionate. In addition, depending on the type of the photosensitive composition used, dimethyl sulfoxide, N,N-dimethylformamide, N-methylpyrrolidinone, etc., may be used to improve the solubility. Alternatively, a solvent with little toxicity may be used such as ethyl lactate or other lactic ester, or propyleneglycol monoethyl acetate.

It should be noted that the compound having formula (I), acid generator, dissolution inhibitor, organic solvent, and any other components of the first photosensitive composition as listed above may be a combination of two types or more as necessary.

First Pattern Forming Process

The first pattern forming process according to the present invention is to form a pattern using the first photosensitive composition described above, and comprises:

(i) a step for applying said first photosensitive composition to a substrate to form a photosensitive layer, (ii) a step for exposing said photosensitive layer to a light pattern, and (iii) a step for developing said exposed photosensitive layer with an alkaline developer.

Any substrate on which to apply the photosensitive composition according to the present invention may be selected from those known in the art. Examples of such substrate include a silicon wafer, a doped silicon wafer, a silicon wafer on which an insulating film, electrodes and/or wiring have been applied, a masked blank, and a semiconductor wafer of GaAs, AlGaAs or other compound in the III–V groups, etc. Alternatively, a chromium- or chromium oxide-deposited substrate, an aluminum-deposited substrate, a BPSG-coated substrate, an SOG-coated substrate, or an SiN-coated substrate may be used.

Also, any process may be used to apply the photosensitive composition to the substrate, such as spin coating, dipping, use of a doctor blade, and curtain coating.

The applied photosensitive composition is heated to dry generally at 170° C. or less, preferably at 70 to 120° C., to form a photosensitive layer.

Next, the photosensitive layer is exposed to a light pattern. Exposure may be via a given mask pattern or by scanning the photosensitive layer directly with an actinic radiation. Any actinic radiation may be used for exposure provided that it contains the wavelength at which the photosensitive composition described above has been sensitized. Examples of such actinic radiation include an ultraviolet ray, the i, h and g line of mercury lamp light, xenon lamp light, deep UV light (e.g., KrF, ArF or other excimer laser beam), an X-ray, synchrotron orbital radiation (SOR), an electron beam, a γ-ray, and an ion beam.

The procedure is then followed by heating (baking), if necessary. Heating may be practiced by any method known in the art, generally by direct heating on a hot plate or in a oven, or by infrared irradiation. In a chemically amplifying resist composition, where heating is aimed to accelerate the reaction catalyzed by an acid, the temperature of heating is controlled generally to 150° C. or less to prevent excessive diffusion of the acid.

The next step is development of the photosensitive layer with an alkaline developer. Any developer known in the art may be used for this purpose. Examples of such developer include: (a) aqueous solution of an organic alkali such as tetramethylammonium hydroxide, tetraethylammonium hydroxide or choline; and (b) aqueous solution of an inorganic alkali such as potassium hydroxide or sodium hydroxide. The concentration of the alkaline developer is not limited in any way. However, it is preferably controlled to 1 N or less in order to effectively differentiates the rate of dissolution between the exposed and unexposed areas on the photosensitive layer, that is, to make the dissolution contrast higher.

The resist pattern according to the present invention comprises steps (i) through (iii) above and, if necessary, may include additional steps. For example, the above steps may be combined with a step for forming a leveling layer on the substrate prior to the application of a photosensitive layer, a step for forming an antireflective layer to reduce the reflection of exposing light, a step for forming an overcoat film to reduce the effects of air-born substances (in the case of a chemically amplifying resist), a rinsing step for washing the developed substrate in water or other medium to remove the developer and other substances, a step for re-exposure with an ultraviolet radiation prior to dry etching, or other steps.

Second Photosensitive Composition

The second photosensitive composition according to the present invention comprises: (a) a compound which is glassy at room temperature and has a cyclic structure with three or more aromatic rings containing an acid-decomposable substituent. This compound may have any molecular weight; however, the preferable number-average molecular weight as calculated for polystyrene is 2000 or less, most preferably 1000 or less. It should be noted that an overly high molecular weight might result in poor development with a water-base developer or excessive swelling of the layer.

It is preferable that compound (a) have a hydroxyl group and that the hydroxyl group be positioned on the outside of the ring. Such a structure would help increase the solubility to alkaline or water-base developers.

Hitherto, small compounds containing a cyclic phenol derivative have been used to attain desired quality in a photosensitive composition which consists primarily of phenol resin. It has, however, been difficult to form a resist film using a photosensitive composition which consists primarily of a small compound containing a phenol derivative, due to such properties of the small compound as ability of crystallization and resistance to dry etching. The second photosensitive composition according to the present invention now has solved these problems.

The second photosensitive composition according to the present invention consists primarily of compound (a). When this composition is used, the acid-decomposable substituents in compound (a) are entangled with each other to form a resist film, and get untangled as decomposed by an acid generated by compound (b), which generates acid when exposed to an actinic radiation, to allow removal with water or other medium. The composition thus enables development with a water-base developer of pH 11 or less. A low molecular weight is preferred for development with a water-base developer because swelling of the layer is inhibited.

Preferred examples of such compound are those having formula (II):

[II]

where,

X is a divalent organic group which may contain a heteroatom, preferably —S—, —$SO_2$—, —$CH_2$—, —CH($CH_3$)—, —CH($CH_2CH_3$)—, —C($CH_3$)$_2$—, —CH($C_6H_5$)—, —C($CF_3$)$_2$—, —O— or —NH—, p is an integer in the range of 3 or above, q is an integer in the range of 2 to 4, and $R^1$ is an acid-decomposable substituent such as t-butyl, t-butoxycarbonyl, ethoxyethyl, tetrahydropyranyl, or a trialkylsilyl group, which may be identical or non-identical to each other.

Compound (a) exhibits high hydrophilic property at development as each aromatic ring in its molecule has two or more acid-decomposable substituents. Also, the high molecular rigidity attributed to the cyclic structure of the aromatic rings helps reduce swelling at development.

Compounds having formula (II) include those in which the aromatic rings are resorcinol, pyrogallol or pyrocatechol. These compounds can be obtained by, as can the compounds expressed by general formula (I), allowing a phenol derivative to react with an aldehyde or ketone in the presence of an acid catalyst. Preferable examples of such compound (II) for their molecular size are those having formula (IIa):

[IIa]

(where, $R^1$ is an acid-decomposable substituent, which may be identical or non-identical to each other).

Also, compound (a) for use in the second photosensitive composition according to the present invention may contain any substituent unless it impairs the effect of the present invention. Examples of such substituent include aliphatic alkyl (e.g., methyl, ethyl, propyl, pentyl or hexyl), alicyclic (e.g., cyclopentyl or cyclohexyl), aromatic (e.g., phenyl or naphthyl), heterocyclic (e.g., pyridyl, thiophenyl or pyranyl), halogens (e.g., fluorine, chlorine or bromine), nitrile, nitro, carboxyl group, alkylsilanes, and the derivatives of these groups.

When the second photosensitive composition according to the present invention is used as a chemically amplifying positive photoresist, a compound wherein the acid-decomposable substituents ($R^1$ in formula (II) or (IIa)) are replaced with a protecting group which is decomposable by an acid catalyst is used in combination with an acid generator which generates acid when exposed to an actinic radiation. Any substituent decomposable by an acid catalyst as known in the art may be used. Examples of such substituent are the same as in the compounds having formula (I).

The second photosensitive composition according to the present invention comprises compound (b), which generates acid when exposed to an actinic radiation. The acid generator (b) is a compound such as sulfonyl, iodonium or other onium salt or sulfonyl compound, or a sulfonic ester. Examples of such acid generator are the same as in the first photosensitive composition as listed above. The content of the acid generator ranges generally from 0.1 to 30% of the total weight of solid component of the photosensitive composition, preferably from 0.3 to 15%, as in the first photosensitive composition. An acid generator content lower than the above may result in inadequate sensitivity. On the other hand, a higher acid generator content than the above may increase the light absorption by the acid generator at the exposed wavelength, thus lowering the overall transmissivity of the photosensitive composition. The term "solids component" herein refers to the components of a photosensitive composition excluding organic solvent.

The second photosensitive composition according to the present invention comprises: (a) a compound which is glassy at room temperature and has a cyclic structure with three or more aromatic rings containing an acid-decomposable substituent, and (b) acid generator. The photosensitive composition may also contain various additives, if necessary. For example, a compound which exhibits solubility to water when decomposed by an acid catalyst may be contained as a dissolution inhibitor. The photosensitive composition may also contain a small amount of basic compound to relieve the inherent problem of the chemically amplifying resist caused by basic compounds existing in environment, as in the first photosensitive composition. The conditions on the type and content of the basic compound to be added are the same as in the first photosensitive composition which has been described above.

The second photosensitive composition according to the present invention is prepared by dissolving the components described above generally in organic solvent and, if necessary, filtrating through a membrane filter or other filter. The organic solvent is selected from those generally used in the art. Examples of such organic solvent are the same as in the first photosensitive composition.

It should be noted that any of compound (a), acid generator (b), dissolution inhibitor, organic solvent, and any other components of the second photosensitive composition listed above may be a combination of two types or more if necessary.

Second Pattern Forming Process

The second pattern forming process according to the present invention is to form a pattern using the second photosensitive composition described above, and comprises:

(i) a step for applying said second photosensitive composition to a substrate to form a photosensitive layer, (ii) a step for exposing said photosensitive layer to a light pattern, and (iii) a step for developing said exposed photosensitive layer with a water-base developer of pH 11 or less.

The second pattern forming process differs from the first pattern forming process in the photosensitive composition used (which should obviously be the second photosensitive composition) and the developing step.

In the second pattern forming process, a water-base developer of pH 11 or less is used for development. A typical example of water-base developer of pH 11 or less is pure water. However, the water-base developer may contain any component unless it impairs the effect of the present invention. Also, tap water may be used. The pH preferable range of such water-base developer is 2 to 11.

The water-base developer of pH 11 or less may contain any additive, if necessary, to attain a desired property. For example, addition of a surfactant or heating would decrease the developer's surface tension, and a small amount of basic compound or neutral salt would increase development activity. Also, the developer may be at any temperature; it may be iced or warm.

The second pattern forming process differs from the first pattern forming process which has been described above in the photosensitive composition used and the developing step; otherwise, any condition may be selected from those described for the first pattern forming process.

EXAMPLES

Preparation 1

A mixture of 100 ml of 38% formaldehyde and 130 ml of concentrated hydrochloric acid was cooled to 0° C., and 25 g of veratrole was dripped in it, within 30 minutes, while stirring the mixture with a mechanical stirrer. After the mixture was stirred for a day, the resultant precipitate was filtrated. The precipitate was allowed to recrystallize from a mixture of toluene and acetone (9:1) to prepare cyclotriveratrylene (hereinafter referred to as "CTV"). After 1.35 g of the obtained CTV was dissolved in 15 ml of dichloromethane, 19 ml of 1.0 M dichloromethane solution of boron tribromide was dripped, taking 30 minutes, while stirring. After the mixture was stirred for a day, it was mixed with 50 ml of water and extracted with ethyl acetate. Then, after the organic layer was separated and dried with sodium sulfate anhydride, the solvent was removed using an evaporator to prepare cyclotricatechilene (hereinafter referred to as "CTC").

Preparation 2

The same procedure as in Preparation 1 was followed to prepare CTM except that 22.5 g of o-methoxyphenol was used in lieu of veratrole.

Preparation 3

A mixture of 0.5 g of CTC and 0.650 g of 2,1,4-naphthoquinone diazide sulfonyl chloride was dissolved in 10 ml acetone. Then, 1.3 g of 37% sodium carbonate solution was dripped in the mixture, taking 20 minutes, while stirring the mixture, followed by 1 hour of stirring. The mixture was transferred in water, and extracted with ethyl acetate. After the organic layer was separated and dried with sodium sulfate anhydride, the solvent was removed using an evaporator to prepare CTC-n. The obtained CTC-n was examined by NMR and showed that 30% of the hydroxyl groups in the CTC have undergone substitution with 4-naphthoquinone diazide sulfonic ester groups.

Preparation 4

A 0.5 g sample of CTC was dissolved in 5 ml of tetrahydrofuran, then mixed with 0.098 g of sodium hydride (in oil) and 0.53 g of di-t-butyl dicarbonate, and stirred for a day. The mixture was transferred in water, and extracted with ethyl acetate. After the organic layer was separated and dried with sodium sulfate anhydride, the solvent was removed using an evaporator to prepare CTC-tA. The obtained CTC-tA was examined by NMR and showed that 27% of the hydroxyl groups in the CTC have undergone substitution with t-butoxycarbonyl groups (hereinafter referred to as "t-Boc").

Preparation 5

The procedure in Preparation 4 was followed to prepare CTM-t except that CTM was used in lieu of CTC. The obtained CTM-t was examined by NMR and showed that 27% of the hydroxyl groups in the CTM have undergone substitution with t-Boc.

Preparation 6

The procedure in Preparation 1 was followed to prepare CTA except that acetaldehyde was used in lieu of formaldehyde, and 2-methoxyphenol in lieu of veratrole.

Preparation 7

CTM was processed to prepare CTP as schematically shown below:

The cyclic phenol compounds thus obtained were dissolved in methoxymethyl propionate at the ratios shown in Table 1 to prepare resist solutions 1 to 6. Triphenylsulfonium trifurate was used as an acid generator, and 4,4'-methylene-bis[2,6-bis(hydroxymethyl)phenol] as a cross-linking agent. The ratios given in the table are expressed as percentages of the total weight of solid component in the photosensitive composition.

TABLE 1

| Resist solution | Cyclic phenol compound | (wt %) | Acid generator (wt %) | Cross-linking agent (wt %) |
|---|---|---|---|---|
| Resist 1 | CTC-tA | 98 | 2 | — |
| Resist 2 | CTM-2 | 98 | 2 | — |
| Resist 3 | CTP | 78 | 2 | 20 |
| Resist 4 | CTM | 78 | 2 | 20 |
| Resist 5 | CTA | 78 | 2 | 20 |
|  | CTC-n | 100 | — | — |

Examples 1 to 6

Each of the obtained resist solutions was applied to a silicon wafer by spin coating to form a resist film with a thickness of 0.2 $\mu$m. The obtained resist film was baked at 95° C. for 2 minutes, and scanned with an electron beam scanner (electron beam accelerating voltage: 50 keV) to draw a pattern. After exposure, the resist film was baked if necessary and developed with aqueous solution of tetramethylammonium hydroxide (TMAH) to obtain a pattern.

Reference 1

Hexamethylhexaacetoxycalixarene was dissolved in chlorobenzene to form a film with a thickness of 10 nm in the same manner as in Example 1. Then, the film was scanned with an electron beam as in Example 1, and developed with a xylene developer to obtain a pattern. The resist was not developable with aqueous solution of TMAH.

Reference 2

A polystyrene sample with a molecular weight of 20,000 was dissolved in toluene to form a film with a thickness of 20 nm in the same manner as in Example 1. Then, the layer was scanned with an electron beam and developed as in Reference 1 to obtain a pattern. Again, the resist was not developable with aqueous solution of TMAH.

The process conditions and the results are shown Table 2:

TABLE 2

| Ex. No. | Resist Soln. | PEB* (temp /time) | Developer | Sensitivity ($\mu$C/cm$^2$) | Resolution ($\mu$m) | Edge Roughness |
|---|---|---|---|---|---|---|
| Ex. 1 | 1 | 95° C. /90 sec | TMAH (0.013N) | 20 | 0.04 | smooth |
| Ex. 2 | 2 | 95 ° /90 sec | TMAH (0.27N) | 20 | 0.04 | Smooth |

TABLE 2-continued

| Ex. No. | Resist Soln. | PEB* (temp /time) | Developer | Sensitivity (μC/cm²) | Resolution (μm) | Edge Roughness |
|---|---|---|---|---|---|---|
| Ex. 3 | 3 | 100° C. /60 sec | TMAH (0.27N) | 25 | 0.04 | smooth |
| Ex. 4 | 4 | 100° C. /60 sec | TMAH (0.27N) | 17 | 0.04 | smooth |
| Ex. 5 | 5 | 110° C. /60 sec | TMAH (0.27N) | 15 | 0.04 | smooth |
| Ex. 6 | 6 | — | TMAH (0.13N) | 80 | 0.04 | smooth |
| Ref. 1 | — | — | Xylene | 5000 | 0.04 | smooth |
| Ref. 2 | — | — | Xylene | 20000 | 0.04 | rough |

*PEB: Post Exposure Baking

The results shown in Table 2 demonstrate that a pattern formed on the resists according to the present invention was developable with aqueous solution of an alkali and exhibits high sensitivity, excellent edge roughness, and high resolution.

Preparation 8

A 0.5 g sample of CTC was dissolved in 5 ml of tetrahydrofuran, then mixed with 0.131 g of sodium hydride (in oil) and 0.9 g of di-t-butyl dicarbonate, and stirred for a day. The mixture was transferred in water, and extracted with ethyl acetate. After the organic layer was separated and dried with sodium sulfate anhydride, the solvent was removed using an evaporator to prepare CTC-tB. The obtained CTC-tB was examined by NMR and showed that 50% of the hydroxyl groups in the CTC have undergone substitution with t-butoxycarbonyl groups.

The CTC-tB thus obtained and the CTC-tA obtained above were dissolved in methoxymethyl propionate at the ratios given in Table 3 and at a solids content of 12.5%, then filtrated through a 0.2 μm membrane filter, to prepare resist solutions 7 to 11. The average molecular weights of CTC-tB and CTC-tA were 666 and 528, respectively.

TABLE 3

| Resist 7 | CTC-tA | 400 mg | PAG-1 | 6 mg |
|---|---|---|---|---|
| Resist 8 | CTC-tA | 400 mg | PAG-2 | 10 mg |
| Resist 9 | CTC-tB | 400 mg | PAG-1 | 6 mg |
| Resist 10 | CTC-tB | 400 mg | PAG-2 | 10 mg |
| Resist 11 | CTC-tA | 400 mg | PAG-3 | 15 mg |

PAG-1

PAG-2

PAG-3

Examples 7 to 12

Each of the obtained resist solutions was applied to a silicon wafer by spin coating to form a resist film with a thickness of 0.2 μm. The obtained resist film was baked at 95° C. for 2 minutes, and scanned with an electron beam scanner (electron beam accelerating voltage: 50 keV) or an i-line stepper to draw a pattern. After exposure, the resist film was baked if necessary and developed by applying running water (pH<11) for 40 seconds.

Reference 3

The sample was 2 g of polymer which had the same molecular structure as polyhydroxystyrene with a molecular weight of 20,000 except that 20% of the hydroxyl groups have undergone substitution with t-Boc groups. The sample was dissolved in 10 ml of methoxymethylpropionic ester, together with 20 mg of triphenylsulfonium trifurate for use as an acid generator, to prepare a resist solution. The resist solution was applied to a silicon wafer by spin coating to form a resist film with a thickness of 0.2 μm. The obtained resist film was baked at 95° C. for 2 minutes, and scanned with an electron beam scanner (electron beam accelerating voltage: 50 keV) to draw a pattern. After exposure, the film was baked if necessary and developed by applying running water for 40 seconds.

Reference 4

Hexamethylhexaacetoxycalixarene was dissolved in chlorobenzene and applied to a silicon wafer by spin coating, then baked at 100° C. for 60 seconds to form a resist film with a thickness of 10 nm. Then, the film was scanned with an electron beam scanner (electron beam accelerating voltage: 50 keV) to draw a pattern, and developed by applying running water for 40 seconds.

The process conditions are results are shown in Table 4:

TABLE 4

| Ex. No. | Resist Soln. | PEB (temp /time) | Water development (*1) | Exposer (*2) | sensitivity | Resolution (μm) |
|---|---|---|---|---|---|---|
| Ex. 7 | 7 | 95° C./ 90 sec | Ok | E | 24 μC/cm² | 0.4 |
| Ex. 8 | 8 | 95° C./ 90 sec | Ok | E | 30 μC/cm² | 0.4 |
| Ex. 9 | 9 | 100° C./ 60 sec | Ok | E | 25 μC/cm² | 0.4 |
| Ex. 10 | 10 | 100° C./ 60 sec | Ok | E | 27 μC/cm² | 0.4 |
| Ex. 11 | 11 | 110° C./ 60 sec | Ok | E | 15 μC/cm² | 0.4 |

TABLE 4-continued

| Ex. No. | Resist Soln. | PEB (temp /time) | Water development (*1) | Exposer (*2) | sensitivity | Resolution (μm) |
|---|---|---|---|---|---|---|
| Ex. 12 | 8 | 110° C./ 60 sec | Ok | I | 80 mJ/cm² | 0.4 |
| Ref. 3 | — | 95° C./ 60 sec | NG | E | — | — |
| Ref. 4 | — | — | NG | E | — | — |

The results shown in Table 4 demonstrate that the photosensitive compositions according to the present invention were developable with a water-base developer of pH 11 or less, while the resists in References 1 to 3 did not form a pattern when developed with water.

Figure 1:
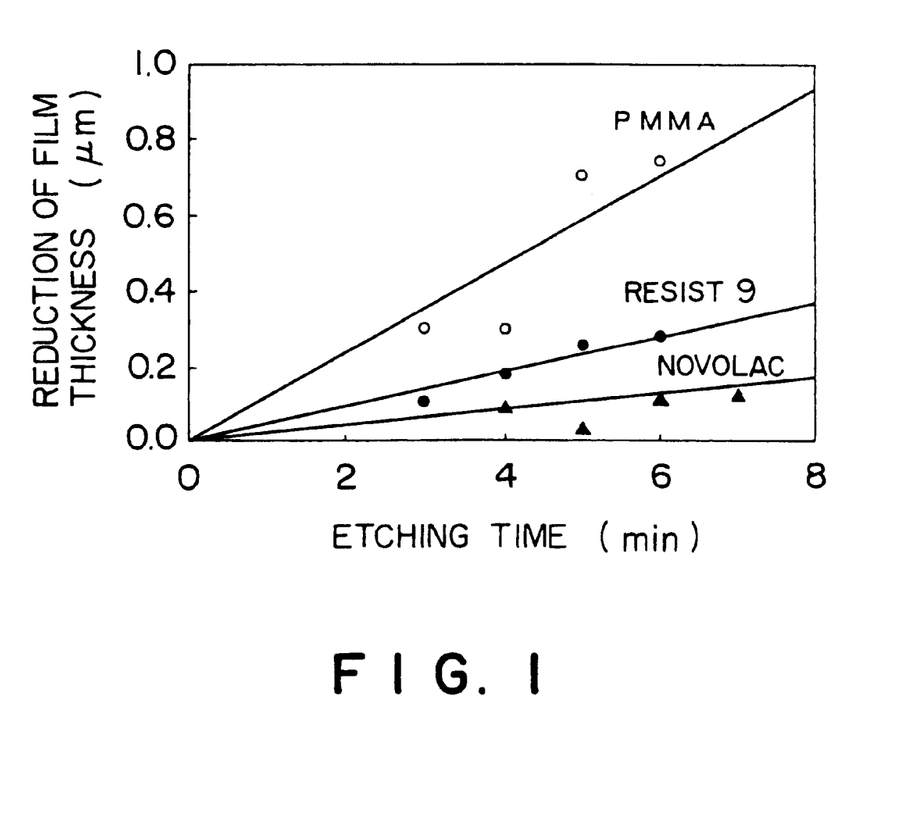
FIG. 1 shows the dry etching resistance property of resists using the photosensitive compositions according to the present invention.

Resist 9 was further analyzed for resistance to dry etching. Novolac resin and polymethyl methacrylate (PMMA) were used as references. These samples were dry-etched using $CF_4$ as etching gas, and examined for the reduction of film thickness after etching. The results are shown in FIG. 1.

The etching rate of Resist 9 was slightly inferior to that of the novolac resin, which is one of the most resistant to dry etching of all resist materials. However, Resist 9 exhibited reasonably higher resistance to dry etching than PMMA, which is a commonly used high-resolution electron beam resist, proving its practical utility.

What is claimed is:

1. A photosensitive composition comprising a solid component and a solvent, and containing a compound having formula (I) accounting for 50% or more of the total weight of the solid component:

[I]

wherein X is a group selected from the group consisting of —S—, —SO₂—, —CH₂—, CH(CH₃)—, —CH(CH₂CH₃)—, —C(CH₃)₂—, —CH(C₆H₅)—, C(CF₃)₂—, —O— and —NH—, the R's, which may be the same or different, are selected from hydrogen or a univalent organic group, and l, m and n are independently an integer in the range of 1 to 4, which may be the same or different, and a photosensitive component which is selected from the group consisting of a photoacid generator and a photosensitive substituent joined to the compound having formula (I).

2. A photosensitive composition according to claim 1, wherein the solids component further comprises a cross-linking agent and an acid generator which generates acid when exposed to an actinic radiation.

3. A photosensitive composition according to claim 2, wherein the acid generator is an onium salt compound, sulfonyl compound or a sulfonyl ester.

4. A photosensitive composition according to claim 2 containing a cross-linking agent accounting for 0.1 to 49.9% of the total weight of solid component.

5. A photosensitive composition according to claim 1 containing an acid generator accounting for 0.1 to 30% of the total weight of solid component.

6. A photosensitive composition according to claim 1, wherein R is 4-naphthoquinone diazide ester group or 5-naphthoquinone diazide sulfonic ester group.

7. A photosensitive composition according to claim 1 further comprising a derivative of 4-naphthoquinone diazide or a derivative of 5-naphthoquinone diazide.

8. A photosensitive composition according to claim 1 further comprising an acid generator which generates acid when exposed to an actinic radiation, wherein R in general formula (I) is a group which generates a polar group when decomposed by a reaction catalyzed by an acid.

9. A photosensitive composition according to claim 1 comprising a compound having formula (I) and 4- or 5-naphthoquinone diazide sulfonic ester.

10. A photosensitive composition according to claim 1 further comprising a basic compound.

11. A photosensitive composition according to claim 10, wherein the basic compound is selected from the group consisting of a pyridine derivative, an aniline derivative, an amine compound, and an indene compound.

12. A photosensitive composition according to claim 1, wherein the compound having formula (I) is a compound of formulae (Ia) or (Ib):

(Ia)

(Ib)

wherein X is selected form the group consisting of —S—, —SO₂—, CH₂, —CH(CH₃)—, —CH(CH₂CH₃)—, C(CH₃)₂—, —CH(C₆H₅)—, C(CF₃)₂—, —O—, and —NH—, the R's which may be the same or different, are selected from hydrogen or a univalent organic group.

13. A photosensitive composition comprising:
(a) a compound which is glassy at room temperature and has a cyclic structure composed of (a1) three aromatic rings containing an acid-decomposable substituent, accounting for 50% or more of the total weight of solid component, wherein said aromatic rings are linked with each other via (a2) divalent groups selected from the group consisting of —S—, —SO₂—, —CH₂—, —CH(CH₃)—, —CH(CH₂CH₃)—, —C(CH₃)₂—, —CH(C₆H₅)—, —C(CF₃)₂—, —O— and —NH—, and
(b) an acid generator, which is developable with a water-base developer of pH 11 or less, the cyclic structure containing 3 aromatic rings (a1) alternating with 3 divalent groups (a2) connected to form a cycle.

14. A photosensitive composition according to claim 13, wherein the number-average molecular weight of compound (a) as calculated for polystyrene is 2000 or less.

15. A photosensitive composition according to claim 13, wherein compound (a) has a hydroxyl group bound to the aromatic ring, said hydroxyl group positioned on the outside of the cyclic structure.

16. A photosensitive composition according to claim 13, wherein compound (a) has formula (II):

[II]

wherein,
X is a group selected from the group consisting of —S—, —SO$_2$—, —CH$_2$—, —CH(CH$_3$)—, —CH(CH$_2$CH$_3$)—, —C(CH$_3$)$_2$—, —CH(C$_6$H$_5$)—, —C(CF$_3$)$_2$—, —O— and —NH—,
q is an integer in the range of 2 to 4, and
the R$^1$'s, which may be the same or different, are an acid-decomposable substituent.

17. A photosensitive composition according to claim 16, wherein X is a group selected from the group consisting of —S—, —SO$_2$—, —CH$_2$—, —CH(CH$_3$)—, —CH(CH$_2$CH$_3$)—, —C(CH$_3$)$_2$—, —CH(C$_6$H$_5$)—, —C(CF$_3$)$_2$—, —O— and —NH—.

18. A photosensitive composition according to claim 16, wherein the acid generator is an onium salt compound, a sulfonyl compound, or a sulfonic ester.

19. A photosensitive composition according to claim 16, wherein the acid generator accounts for 0.1 to 30% of the total weight of solid component.

20. A pattern forming process comprising:
(i) a step for applying a photosensitive composition comprising:
(a) a compound which is glassy at room temperature and has a cyclic structure composed of (a1) three aromatic rings containing an acid-decomposable substituent, accounting for 50% or more of the total weight of solid component, wherein said aromatic rings being linked with each other via (2) divalent groups selected form the group consisting of —S—, —SO$_2$—, —CH$_2$—, —CH(CH$_3$)—, —CH(CH$_2$CH$_3$)—, —C(CH$_3$)$_2$—, —CH(C$_6$H$_5$)—, —C(CF$_3$)$_2$—, —O— and —NH—, and
(b) an acid generator, to a substrate to form a photosensitive layer,
(ii) a step for exposing said photosensitive layer to a light pattern, and
(iii) a step for developing said exposed photosensitive layer with a water-base developer of pH 11 or less, the cyclic structure containing 3 aromatic rings (a1) alternating with 3 divalent rings (a2) connected to form a cycle.

21. A pattern forming process according to claim 20, wherein the pH of the water-base developer is in the range of 2 to 11.

22. A pattern forming process according to claim 20 comprising a heating step after the light pattern exposure step (ii).

23. A pattern forming process comprising:
(i) a step for applying a photosensitive composition comprising a compound having formula (I) accounting for 50% or more of the total weight of solid component to a substrate to form a photosensitive layer:

[I]

where,
X is a group selected from the group consisting of —S—, —SO$_2$—, —CH$_2$—, —CH(CH$_3$)—, —CH(CH$_2$CH$_3$)—, —C(CH$_3$)$_2$—, —CH(C$_6$H$_5$)—, —C(CF$_3$)$_2$—, —O— and —NH—,
the R's, which may be same or different, are hydrogen or a univalent organic group, and
l, m and n are integer in the range of 1 to 4, which may be same or different, and a photosensitive component which is selected from the group consisting of a photoacid generator and a photosensitive substituent joined to the compound having formula (I),
(ii) a step for exposing said photosensitive layer to a light pattern, and
(iii) a step for developing said exposed photosensitive layer with an alkaline developer.

24. A pattern forming process according to claim 23 comprising a heating step after the light pattern exposure step (ii).

25. A pattern forming process according to claim 23, wherein heating is performed at a temperature of 150° C. or less.

26. A photosensitive composition comprising:
(a) a compound which is glassy at room temperature and has formula (IIa)

(IIa)

where the R$^1$'s, which may be same or different, art each an acid-decomposable substituent, and
(b) an acid generator.

* * * * *